(12) United States Patent
Gower et al.

(10) Patent No.: US 6,573,784 B2
(45) Date of Patent: Jun. 3, 2003

(54) LOW POWER WIDE BANDWIDTH PROGRAMMABLE GAIN CDS AMPLIFIER/INSTRUMENTATION AMPLIFIER

(75) Inventors: Richard Leigh Gower, San Jose, CA (US); Bhupendra Kumar Ahuja, Fremont, CA (US); J. Antonio Salcedo, Livermore, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 09/945,263

(22) Filed: Aug. 31, 2001

(65) Prior Publication Data

US 2003/0042975 A1 Mar. 6, 2003

(51) Int. Cl.[7] ................................. H03F 3/45
(52) U.S. Cl. ........................... 330/9; 330/292
(58) Field of Search ............... 330/9, 253, 292, 330/310, 311; 327/124, 560

(56) References Cited

U.S. PATENT DOCUMENTS

| | | | |
|---|---|---|---|
| 4,287,441 A | | 9/1981 | Smith ..................... 327/94 |
| 5,376,899 A | * | 12/1994 | Pass ...................... 330/253 |
| 5,703,524 A | | 12/1997 | Chen ..................... 327/560 |
| 5,796,361 A | | 8/1998 | Levinson ............... 341/172 |
| 6,018,269 A | * | 1/2000 | Viswanathan ......... 330/253 |
| 6,025,875 A | | 2/2000 | Vu et al. ............... 348/241 |
| 6,118,340 A | * | 9/2000 | Koen .................... 330/253 |

OTHER PUBLICATIONS

Kasha, Dan B. Et Al., "A 16–mW, 120–dB Linear Switched–Capacitor Delta Sigma Modulator with Dynamic Biasing," IEEE Journal of Solid–State Circuits, vol. 34, No. 7, pp. 921–925, Jul. 1999.

Lewis, Stephen H., "Optimizing the Stage Resolution in Pipelined, Multistage, Analog–to–Digital Converters for Video–Rate Applications," IEEE Transactions on Circuits and Systems–II: Analog and Digital Signal Processing, vol. 39, No. 8, pp. 516–523, Aug. 1992.

Mangelsdorf, C., Et Al., "A CMOS Front–End for CCD Cameras," 1996 IEEE International Solid–State Circuits Conference, pp. 190–191, 1996.

Abo, Andrew M., et al. "A 1.5–V, 10–bit, 14.3–MS/s CMOS Pipeline Analog–to–Digital Converter," IEEE Journal of Solid–State Circuits, vol. 34, No. 5, May 1999.

Nakamura, K., et al., "A CMOS Analog Front End Chip–Set for Mega Pixel Camcorders," 2000 IEEE International Solid–State Circuits Conference, pp. 190–191, 2000.

\* cited by examiner

Primary Examiner—Timothy P. Callahan
Assistant Examiner—Linh Nguyen
(74) Attorney, Agent, or Firm—Townsend and Townsend and Crew LLP

(57) ABSTRACT

A method and circuitry for implementing programmable gain. More particularly, embodiments of the present invention provide an amplifier circuit which can be used as a CDS-amp or an instrumentation amplifier. Included is a two-stage amplifier, each stage having a few as one transistor. A current source biases one stage of the two-stage amplifier. A load resistor network couples to the two-stage amplifier and is configured to set gain values for the two-stage amplifier.

21 Claims, 4 Drawing Sheets

LOW POWER WIDE BANDWIDTH PROGRAMMABLE GAIN CDS AMPLIFIER/INSTRUMENTATION AMPLIFIER

CROSS-REFERENCES TO RELATED APPLICATIONS

This application is related to another application of the same inventors, filed May 18, 2001, entitled "A High Bandwidth Image Sampling Circuit Based on a Transconductance, Transimpedance and Switched Capacitor Amplifier," Application Ser. No. 09/860905, [010262-013600US].

BACKGROUND OF THE INVENTION

The present invention relates generally to integrated circuits. More particularly, embodiments of the invention relate to a method and circuitry for implementing a low-power wide-bandwidth programmable-gain amplifier.

For charge-coupled-device (CCD) based digital cameras having greater than 1 million pixels, an analog front end (AFE) is needed for processing the CCD signals.

High-gain and high-speed are important requirements for CCD digital cameras, as well as for other handheld and portable consumer devices. Correlated double sampling amplifiers (CDS-amp) are employed within AFEs at the front end. CDS-amps should have a programmable gain of 6 or 12 dB with fast settling requirements due to full signal swings from pixel to pixel at 30 MSPS. Because the prior art employs operational amplifiers (op-amps) to provide high-gain, parasitics from the op-amp elements (resulting in lower bandwidth) cause a slowing effect.

Low-noise is another important requirement for CCD digital cameras. To improve the overall system signal-to-noise ratio (SNR) of an AFE, or any instrumentation amplifier system, as much signal gain as the technology allows should be applied in the first input stage of the AFE. A problem is that the state of the art technology should sufficiently amplify the signal yet minimize noise at the first input stage of the AFE. In a CCD digital camera, a CDS-amp in the AFE might provide sufficient gain. However, because the prior art uses full op-amps to provide this gain, more inherent noise is present in such systems.

Low power is another important requirement. Handheld and portable consumer devices can be smaller and lighter when they consume lower power because battery sizes can be small and lighter. The power dissipation of the prior art can be in excess of 25 mW.

U.S. Pat. No. 4,287,441 describes a CDS-amp which is power hungry and has a lower bandwidth (about 20 MHz) because it requires the use of full op-amps to implement the CDS-amp.

A paper, "Instrumentation Amplifiers: Versatile Differential Input Gain Blocks" describes an instrumentation amplifier which used full op-amps. Application Note AN-75, Burr Brown Handbook of Linear IC Applications, Burr Brown, Tucson, Ariz., 1987.

Instrumentation amplifiers made by Analog Devices, part AD522, and Burr Brown (now Texas Instruments), INA101, so-called Triple Op-amp Instrumentation Amplifiers IC chips, use three op-amps.

Thus, there is a need for an improved amplifier circuit that can be used in correlated double sampling. The circuit should be a high-gain high-speed circuit. This circuit should also be a low-noise low-power circuit.

BRIEF SUMMARY OF THE INVENTION

The present invention achieves the above needs with a method and circuitry for implementing amplifiers. More particularly, embodiments of the present invention provide methods and circuitry to achieve a low-power wide-bandwidth programmable-gain amplifier that used as a CDS-amp or an instrumentation amplifier. The circuit also operates at high speeds and low noise.

Embodiments of the present invention provide an amplifier circuit which can be used as a CDS-amp or an instrumentation amplifier. Included is a two-stage amplifier, each stage having as few as one transistor. A current source biases one stage of the two-stage amplifier. A load resistor network couples to the two-stage amplifier and is configured to set the gain value for the two-stage amplifier.

Because the amplifier has as few as two transistors, there are fewer parasitics which enables it to operate at higher speeds, and it dissipates little power and generates little noise, unlike typical op-amps.

In one embodiment, an amplifier circuit includes a first two-stage amplifier and a second two-stage amplifier, each stage having a few as one transistor. A current source biases one stage of each two-stage amplifier. A load resistor network couples between the first and second two-stage amplifiers and is configured to set gain values for the first and second two-stage amplifiers.

In another embodiment the load resistor network is programmable such that the load resistor network can toggle the gain values of the first and second amplifiers between at least two different values.

Embodiments of the present invention achieve their purposes and benefits in the context of known circuit and process technology and known techniques in the electronic and process arts. Further understanding, however, of the nature, objects, features, and advantages of the present invention is realized by reference to the latter portions of the specification, accompanying drawings, and appended claims. Other objects, features, and advantages of the present invention will become apparent upon consideration of the following detailed description, accompanying drawings, and appended claims.

DETAILED DESCRIPTION OF THE INVENTION

Figure 1A:
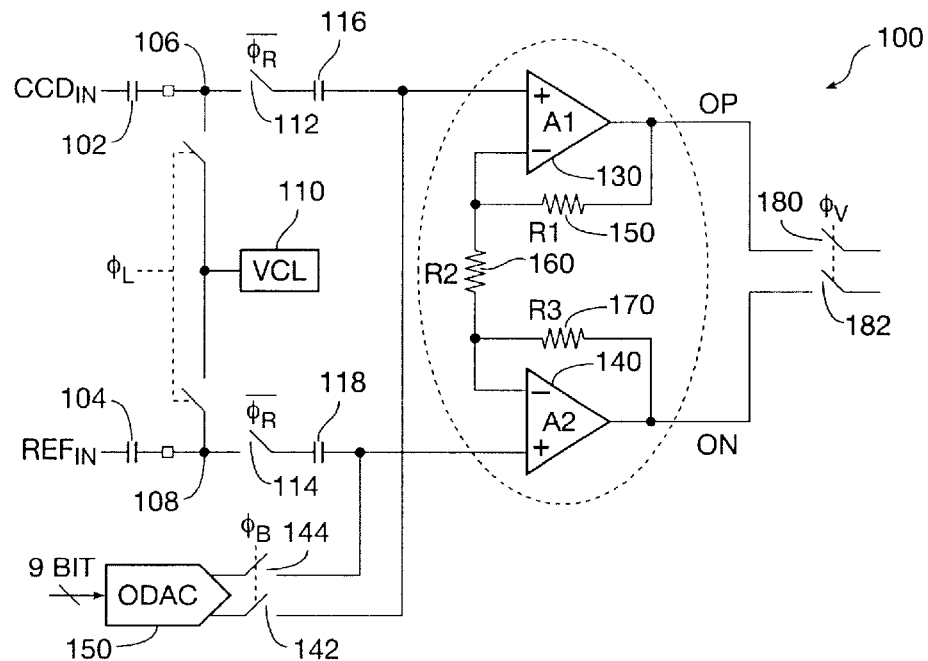
FIG. 1a shows a simplified high-level block diagram of an exemplary CDS-amp, according to the prior art.

FIG. 1a shows a simplified high-level block diagram of an exemplary CDS-amp 100, according to the prior art. In this specific embodiment, CDS-amp 100 is the front end of an AFE (not shown).

CCD signals CCDin and REFin are AC coupled to CDS-amp 100 through decoupling capacitors 102 and 104. In this specific embodiment, capacitors 102 and 104 are external to CDS-amp 100. A voltage clamp 110 couples to decoupling capacitors 102 and 104 at a node 106 and a node 108. Node 106 couples to a switch 112 which couples to a capacitor 116. Node 108 couples to a switch 114 which couples to a capacitor 118. Capacitors 116 and 118 couple to the positive inputs of amplifiers 130 and 140, respectively. The outputs of an offset digital-to-analog converter (ODAC) 150 also couple to the positive inputs of amplifiers 130 and 140 via switches 142 and 144, respectively.

Amplifier 130 has a load resistor 150, also referred to as resistor R1. The negative input of amplifier 130 couples to the negative input of amplifier 140 by a load resistor 160. Amplifier 140 has a load resistor 170, also referred to as resistor R3. Amplifiers 130 and 140 have outputs $O_P$ and $O_N$, respectively. Outputs $O_P$ and $O_N$ couple to a subsequent stage (not shown) via switches 180 and 182, respectively.

The gain of amplifiers 130 and 140 are set by resistor ratios to give an overall gain of 6 or 12 dB in this specific embodiment. For the CCD signals, the REFin signal is typically a reference DC signal only and thus the gain values are given by following equations:

Gain at $O_P$=(1+R1/R2)

Gain at $O_N$=−R3/R2

Differential Gain=1+(R1+R3)/R2

Thus, by programming or selecting different values of load resistor R2, any specific gain value can be obtained. In this specific embodiment, two different values of gain, namely 6 and 12 dB, can be selected by selecting appropriate values for load resistor R2.

Figure 1B:
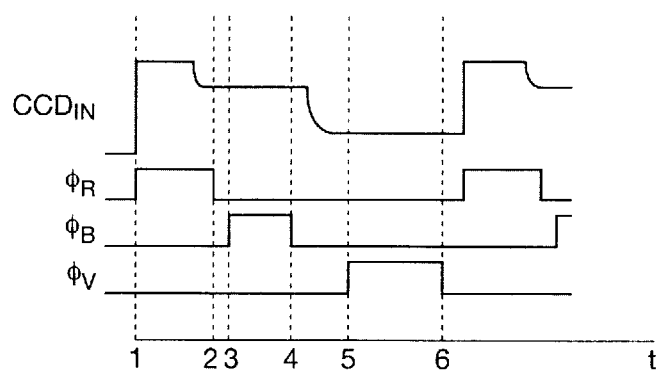
FIG. 1b shows simplified waveforms illustrating the operation of the CDS-amp of FIG. 1a, according to the prior art.

FIG. 1b shows simplified waveforms illustrating the operation of the CDS-amp of FIG. 1a, according to the prior art. Shown are waveforms for a CCD input signal and clock signals $\phi_R$, $\phi_B$ and $\phi_V$ to perform a CDS-amp function.

To avoid large signal feeds through CDS-amp 100, CDS-amp 100 floats from nodes 106 and 108 during a CCD pixel reset phase $\phi_R$ (between t=1 and t=2). During CCD pixel reset phase $\phi_R$, switches 112 and 114 are open. While floating, CDS-amp 100 is isolated and is thus protected from such large signal feeds.

During a black reference phase DB (between t=3 and t=4), a black pixel reference level and a ODAC offset are sampled on internal capacitors 116 and 118. During black reference phase $\phi_B$, switches 142 and 144 are open.

During a video phase $\phi_V$ (between t=5 and t=6) of each pixel, a differenced CCD signal is amplified by amplifiers 130 and 140. During video phase $\phi_V$, switches 180 and 182 are open.

The differenced CCD signal is the difference between the black pixel reference level and the actual pixel level. The differenced CCD signal is then converted from a single ended unipolar signal to a partially differential signals at OP and ON by amplifiers 130 and 140.

Figure 2:
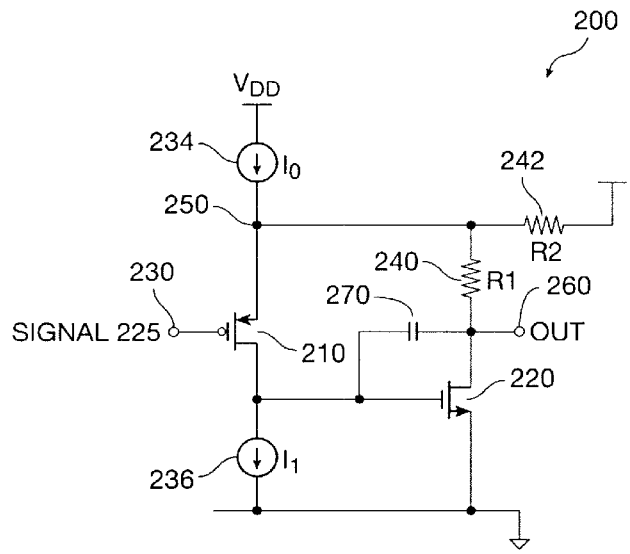
FIG. 2 shows a simplified high-level block diagram of an exemplary two-stage amplifier, according to an embodiment of the present invention.

FIG. 2 shows a simplified high-level block diagram of an exemplary two-stage amplifier 200, according to an embodiment of the present invention. Amplifier 200 includes two transistors 210 and 220. Transistor 210 is the first stage of amplifier 200 and transistor 220 is the second stage. The two stages are complementary. In this specific embodiment, the two stages are directly coupled. Also, in this specific embodiment, transistor 210 is a PMOS transistor and transistor 220 is an NMOS transistor. The specific transistor types will depend on the specific application. In this specific embodiment, amplifier 200 is referenced to ground. In other embodiments amplifier 200 can be referenced to VDD.

An input signal 225 is applied at node 230, which functions as the positive input of amplifier 200. Node 230 is the gate of transistor 210. Two current sources 234 and 236 have current values of $I_0$ and $I_1$, respectively, and are used to bias transistor 210 in the saturation region of operation. Transistor 210 is configured to receive and amplify input signal 225. Transistor 220 is configured to receive and amplify the amplified input signal 255 from transistor 210.

A load resistor 240, also referred to as resistor R1, couples between a drain of transistor 220 and a source of transistor 210. Resistor R1 also couples to a resistor 242, also referred to as resistor R2. Load resistor 242 can couple to a bias source or another circuit element such as another amplifier (not shown) for example. A node 250, which functions as a negative input of CDS-amp 200 follows node 230 with an offset voltage $V_{GS}$ of transistor 210 which is approximately equal to the threshold voltage $V_T$ of transistor 210. Node 260, which is the drain of transistor 220, forms the output node of CDS-amp 200. A capacitor 270 is also provides Miller compensation for transistor. If there is a break in the connection between node 250 and junction of resistors R1 & R2, the open loop gain of this amplifier is given by the following equation:

$$G_{open\ loop} = g_{mp} * r_{dsp} * g_{mn} * R,$$

where $g_{mp}$ and $g_{mn}$ are transconductance values of transistors 210 and 220, respectively, and $r_{dsp}$ and R are effective output impedance values of transistors 210 and 220 (with R1 and R2 load resistors), respectively.

Because two-stage amplifier 200 has only two transistors, there are fewer parasitics. This enables amplifier 200 to operate at higher speeds. It performs openloop-gain and unity-gain frequencies in excess of 200 and 500 MHz, respectively. Also, because amplifier 200 has only two transistors, it dissipates little power and generates little noise, unlike typical op-amps.

It is to be understood that the implementation of FIG. 2 is merely an example and should not limit the scope of the claims herein. In light of the present invention, one of ordinary skill in the art would recognize many other variations, modifications, and alternatives. Also, the described circuit and method can be implemented in a multitude of different forms (i.e., software, hardware, or a combination of both) in a variety of systems.

Figure 3A:
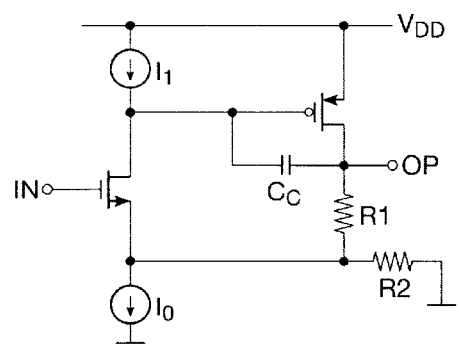
FIGS. 3a–e show simplified high-level schematic diagrams of exemplary two-stage amplifiers, according other embodiments of the present invention.
Figure 3B:
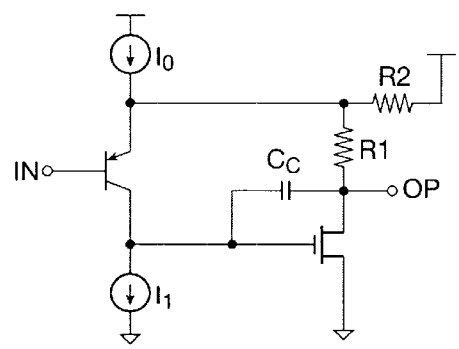
Figure 3C:
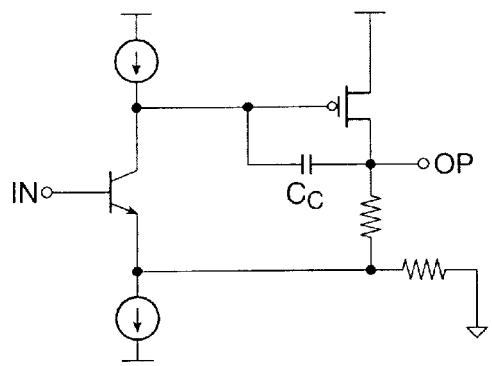
Figure 3D:
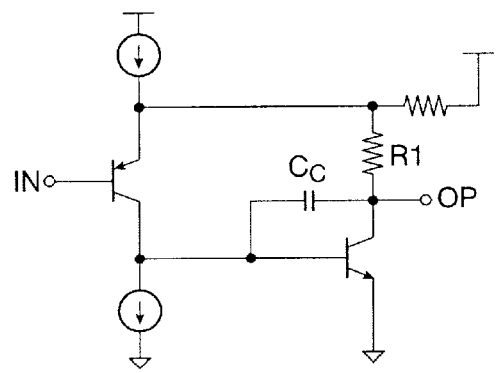
Figure 3E:
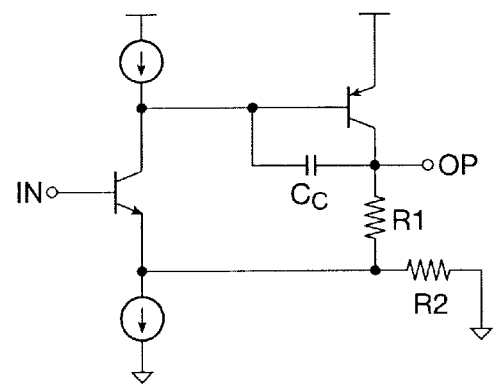

FIGS. 3a–e show simplified high-level schematic diagrams of exemplary two-stage CDS-amps, according other embodiments of the present invention. FIG. 3a shows an NMOS dual version of the amplifier of FIG. 2. FIGS. 3b–c show BiCMOS versions of the amplifier of FIG. 2. FIGS. 3d–e show Bipolar versions of the amplifier of FIG. 2.

In these specific embodiments, each amplifier has one transistor per stage and the transistors are complementary. The first stage of each embodiment is biased by current sources. The load resistors of each embodiment are configured to control the gain of each stage.

Figure 4:
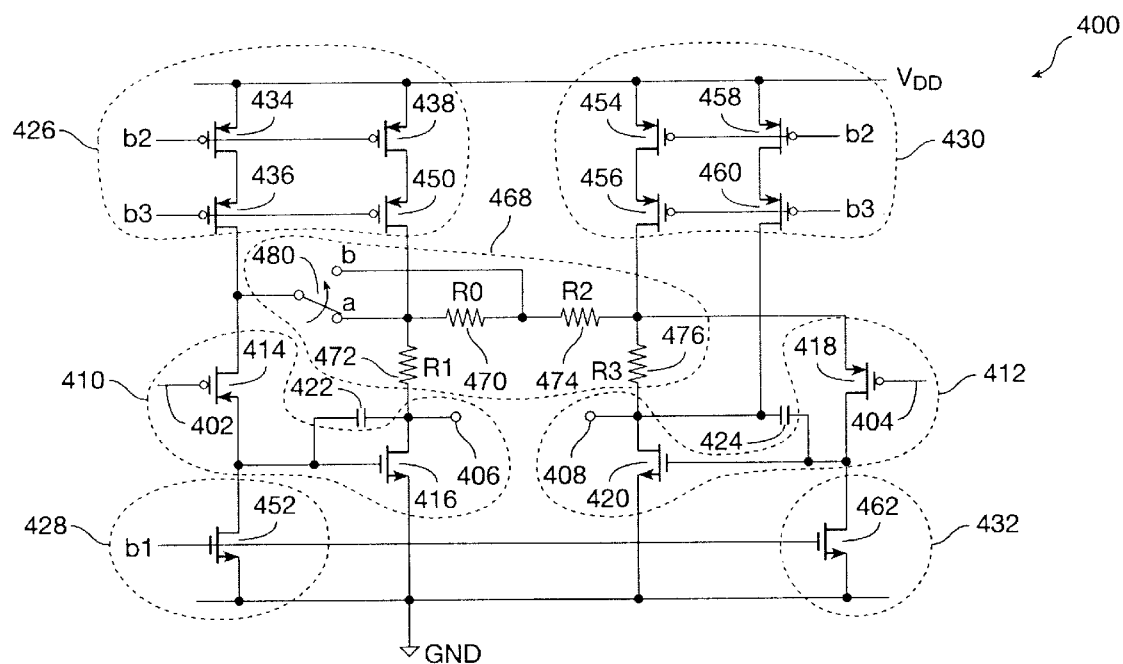
FIG. 4 shows a simplified high-level schematic diagram of an exemplary composite CDS-amp with a programmable gain, according to an embodiment of the present invention.

FIG. 4 shows a simplified high-level schematic diagram of an exemplary composite CDS-amp 400 with a programmable gain, according to an embodiment of the present invention. Composite CDS-amp 400 includes two differential inputs 402 and 404 and differential outputs 406 and 408. In this specific example, input 402 is configured to receive a CCD signal and input 404 is configured to receive a reference signal. Also, differential inputs 402 and 404 are unipolar. Because CCD signals are unipolar in nature, CDS-amp 400 is not completely symmetrical in topology. In this specific embodiment, composite CDS-amp 400 is referenced to ground. In other embodiments CDS-amp 400 can be referenced to VDD.

Composite CDS-amp 400 also includes two active elements 410 and 412 that mirror each other. Each active element includes two stages. Element 410 has a transistor 414 as its first stage and a transistor 416 as its second stage. Transistor 414 is configured to receive and amplify a signal at input 402. Transistor 416 is configured to receive and amplify the signal amplified by transistor 414.

Element 412 has a transistor 418 as its first stage and a transistor 420 as its second stage. Transistor 418 is configured to receive and amplify a signal at input 404. Transistor 420 is configured to receive and amplify the signal amplified by transistor 418. In this specific embodiment, transistors 414 and 418 are PMOS transistors and transistors 416 and 462 are NMOS transistors. Capacitors 422 and 424 provide Miller compensation for transistors 416 and 418, respectively.

Current sources 426 and 428 bias transistor 414 in the saturation region of operation. Similarly, current sources 430 and 432 bias transistor 418 in the saturation region of operation. In this specific embodiment, current source 426 includes PMOS transistors 434, 436, 438 and 450 and current source 428 includes an NMOS transistor 452. Also, current source 430 includes PMOS transistors 454, 456, 458 and 460 and current source 432 includes an NMOS transistor 462. The bias currents are generated by providing gate bias voltages of b1, b2 and b3. In this specific embodiment, CDS-amp 400 has been configured to operate with 10 mW power at a 12-bit SNR level for 30 MSPS CCD signals.

CDS-amp 400 includes a gain-setting element 468 which includes gain-setting resistors 470, 472, 474 and 476, also referred to as resistors R0, R1, R2 and R3, respectively. Also included is a switch 480 which can be programmed to add the resistance value of resistor R) to either of the resistor R1 or R2 values, thus giving different gain values.

In this specific embodiment, two different values of gain, namely 6 and 12 dB, can be selected switch 480. For example, if R0=1.5K, R1=1K, R2=1.5K and R3=2K, and if switch 480 where in position a, $R1_{effective}$=R1=1 KΩ, $R2_{effective}$=(R0+R2)=3 KΩ, and R3=2 KΩ. The resulting gain would be 6 dB. If switch 480 were in position b, $R1_{effective}$=(R0+R1)=2.5 KΩ, $R2_{effective}$=R2=1.5 KΩ, and R3=2 KΩ. The resulting gain would be 12 dB.

It is to be understood that the implementation of FIG. 4 is merely an example and should not limit the scope of the claims herein. In light of the present invention, one of ordinary skill in the art would recognize many other variations, modifications, and alternatives. Also, the described circuit and method can be implemented in a multitude of different forms (i.e., software, hardware, or a combination of both) in a variety of systems.

Figure 5:
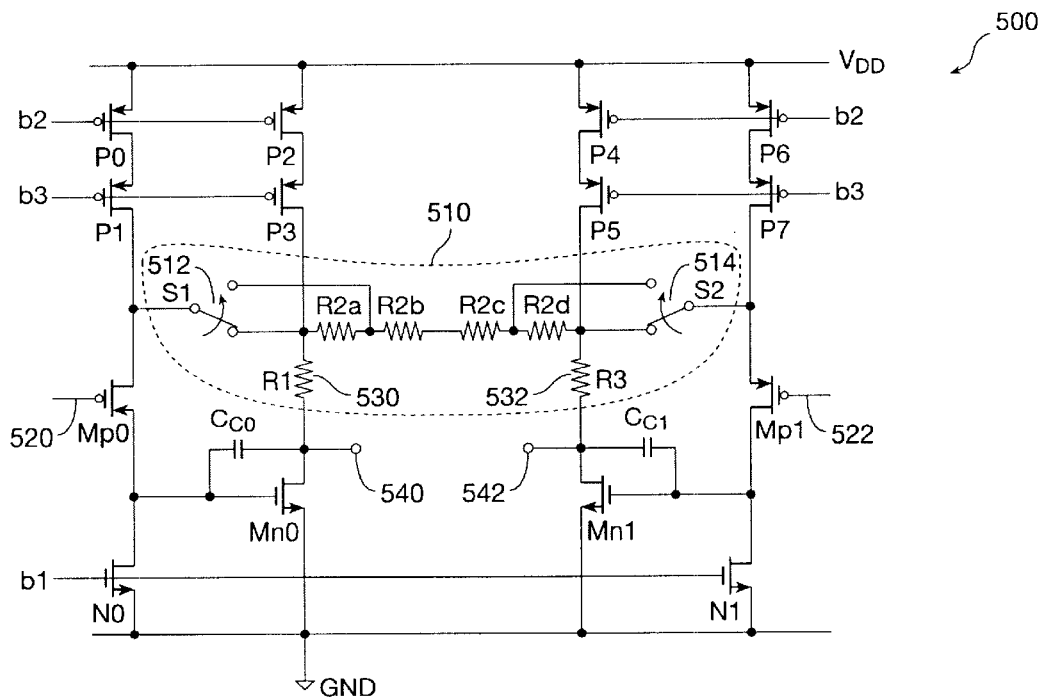
FIG. 5 shows a simplified high-level schematic diagram of an exemplary fully differential general purpose instrumental amplifier with a programmable gain, according to an embodiment of the present invention.

FIG. 5 shows a simplified high-level schematic diagram of an exemplary fully differential general purpose instrumental amplifier 500 with a programmable gain, according to an embodiment of the present invention. Instrumental amplifier 500 is the same circuit as CDS-amp 400 of FIG. 4 except amplifier 500 is implemented as a general purpose instrumental amplifier and amplifier 500 includes a gain-setting element 510 with a different configuration from the gain-setting element of CDS-amp 400. Otherwise, amplifier 500 and CDS-400 operate similarly. Referring to FIG. 5, gain-setting element 510 includes two switches 512 and 514.

In this specific embodiment, amplifier 500 is referenced to ground. In other embodiments amplifier 500 can be referenced to VDD.

In this specific embodiment, an input 520 is configured to receive a first input signal, and input 522 is configured to receive a second input signal. While the DS-amp 400 of FIG. 4 is not completely symmetrical in topology due to CCD signals being unipolar in nature, instrumentation amplifier 500 is configured to receive differential input signals with equal and opposite gain values from the two inputs. Thus, instrumental amplifier 500 can be symmetrical in topology and have balanced signal paths for both inputs 520 and 522.

For gain selection, switches 512 and 514 are employed to change resistor values for both inputs. In this specific embodiment, switches 512 and 514 switch simultaneously. Also, a resistor 530 and 532, also referred to as resistors R1 and R3, respectively, are equal in value. A differential gain between outputs 540 and 542 is given by the following equation:

$$G_{differential}=1+(2*(R1/R2)).$$

It is to be understood that this specific implementation as depicted and described herein is for illustrative purposes only and should not limit the scope of the claims herein, and that alternative circuit implementations exist for the same functionality.

Conclusion

In conclusion, it can be seen that embodiments of the present invention provide numerous advantages. Principally, they achieve high-gain and high-speed while operating with low-power and low-noise. Specific embodiments of the present invention are presented above for purposes of illustration and description. The full description will enable others skilled in the art to best utilize and practice the invention in various embodiments and with various modifications suited to particular uses. After reading and understanding the present disclosure, many modifications, variations, alternatives, and equivalents will be apparent to a person skilled in the art and are intended to be within the scope of this invention. Therefore, it is not intended to be exhaustive or to limit the invention to the specific embodiments described, but is intended to be accorded the widest scope consistent with the principles and novel features disclosed herein, and as defined by the following claims.

What is claimed is:

1. An amplifier circuit used for correlated double sampling, the amplifier circuit comprising:

a first transistor having a gate configured to receive an input signal, the first transistor configured to amplify the input signal and to output an amplified input signal;

a second transistor coupled to the first transistor, the second transistor having a gate configured to receive the amplified input signal from the first transistor, the second transistor configured to amplify the amplified input signal and to output an output signal, the first and second transistors being complementary;

at least two current sources coupled to the first transistor and configured to bias the first transistor in the saturation region of operation;

a first load resistor coupled between the first and the second transistors; and a second load resistor coupled between the first load resistor and a bias source, the ratio of the first and second load resistors setting the gain value of the amplifier circuit.

2. The circuit of claim 1 wherein the first transistor has a first conduction node coupled to the gate of the second transistor and wherein the load resistor couples between a second conduction node of the first transistor and a conduction node of the second transistor.

3. The circuit of claim 1 further comprising a capacitor coupled to the second transistor and configured to provide Miller compensation.

4. The circuit of claim 1 wherein the first transistor is a PMOS transistor and the second transistor is an NMOS transistor.

5. The circuit of claim 1 wherein at least one of the first transistor and the second transistor is a bipolar transistor.

6. The circuit of claim 1 wherein the amplifier is used for instrumentation amplification.

7. An amplifier circuit comprising:
   a first amplifier comprising:
      a first transistor having a gate configured to receive a first input signal, the first transistor configured to amplify the first input signal and to output an amplified first input signal;
      a second transistor coupled to the first transistor, the second transistor having a gate configured to receive the amplified first input signal from the first transistor, the second transistor configured to amplify the amplified first input signal and to output a first output signal; and
   a second amplifier comprising:
      a third transistor having a gate configured to receive a second input signal, the third transistor configured to amplify the second input signal and to output an amplified second input signal;
      a fourth transistor coupled to the third transistor, the fourth transistor having a gate configured to receive the amplified second input signal from the third transistor, the fourth transistor configured to amplify the amplified second input signal and to output a second output signal;
      a first current source coupled to the first transistor and configured to bias the first transistor in the saturation region of operation;
      a second current source coupled to the third transistor and configured to bias the third transistor in the saturation region of operation;
      a load resistor network coupled between the first and second amplifiers and configured to set gain values for the first and second amplifier; wherein the load resistor network is programmable such that the load resistor network can toggle the gain values of the first and second amplifiers between at least two different values.

8. An amplifier circuit comprising:
   a first amplifier comprising:
      a first transistor having a gate configured to receive a first input signal, the first transistor configured to amplify the first input signal and to output an amplified first input signal;
      a second transistor coupled to the first transistor, the second transistor having a gate configured to receive the amplified first input signal from the first transistor, the second transistor configured to amplify the amplified first input signal and to output a first output signal; and
   a second amplifier comprising:
      a third transistor having a gate configured to receive a second input signal, the third transistor configured to amplify the second input signal and to output an amplified second input signal;
      a fourth transistor coupled to the third transistor, the fourth transistor having a gate configured to receive the amplified second input signal from the third transistor, the fourth transistor configured to amplify the amplified second input signal and to output a second output signal;
      a first current source coupled to the first transistor and configured to bias the first transistor in the saturation region of operation;
      a second current source coupled to the third transistor and configured to bias the third transistor in the saturation region of operation;
      a load resistor network coupled between the first and second amplifiers and configured to set gain values for the first and second amplifier; wherein the load resistor network is programmable such that the load resistor network can toggle the gain values of the first and second amplifiers among at least three different values.

9. An amplifier circuit comprising:
   a first amplifier comprising:
      a first transistor having a gate configured to receive a first input signal, the first transistor configured to amplify the first input signal and to output an amplified first input signal;
      a second transistor coupled to the first transistor, the second transistor having a gate configured to receive the amplified first input signal from the first transistor, the second transistor configured to amplify the amplified first input signal and to output a first output signal; and
   a second amplifier comprising:
      a third transistor having a gate configured to receive a second input signal, the third transistor configured to amplify the second input signal and to output an amplified second input signal;
      a fourth transistor coupled to the third transistor, the fourth transistor having a gate configured to receive the amplified second input signal from the third transistor, the fourth transistor configured to amplify the amplified second input signal and to output a second output signal;
      a first current source coupled to the first transistor and configured to bias the first transistor in the saturation region of operation;
      a second current source coupled to the third transistor and configured to bias the third transistor in the saturation region of operation;
      a load resistor network coupled between the first and second amplifiers and configured to set gain values for the first and second amplifier; wherein the load resistor network further comprises:
         a first resistor coupled to the output of the first amplifier;
         a second resistor coupled to the output of the second amplifier; and
         a third resistor coupled between the first and second resistors, the ratio of the first and third resistors setting the gain value of the first amplifier, and the ratio of the second and third resistors setting the gain value of the second amplifier.

10. The circuit of claim 9 wherein the load resistor network further comprises:
   a fourth resistor coupled between the first and second resistors; and
   a switch coupled to the fourth resistor, the switch being programmed to add the resistance value of the fourth resistor to either the resistance value of the first or third resistor thereby providing different gain values for the first and second amplifiers.

11. The circuit of claim 9 wherein the load resistor network further comprises:
   a fourth resistor coupled between the first and second resistors;
   a fifth resistor coupled between the first and second resistors;
   a first switch coupled to the fourth resistor;
   a second switch coupled to the fifth resistor, the first switch being programmed to add the resistance value of the fourth resistor to either the resistance value of the first or third resistor, the second switch being programmed to add the resistance value of the fifth resistor to either the resistance value of the second or third resistor, the positions of the first and second switches thereby providing different gain values for the first and second amplifiers.

12. The circuit of claim 11 wherein the first and second switches are ganged.

13. The circuit of claim 7 wherein at least one of the first and second input signals is unipolar.

14. The circuit of claim 7 wherein the first and second input signals are bipolar.

15. The circuit of claim 7 wherein the first and second input signals are differential input signals.

16. The circuit of claim 7 wherein at least one of the first input signal and the second input signal is a CCD signal.

17. The circuit of claim 7 wherein at least one of the first input signal and the second input signal is a reference signal.

18. The circuit of claim 7 wherein the first and second output signals are differential output signals.

19. The circuit of claim 7 wherein the circuit is a correlated double sampling amplifier.

20. The circuit of claim 7 wherein the circuit is a instrumentation amplifier.

21. An amplifier circuit comprising:
   a first amplifier comprising:
      a first transistor having a gate configured to receive a first input signal, the first transistor configured to amplify the first input signal and to output an amplified first input signal; and
      a second transistor coupled to the first transistor, the second transistor having a gate configured to receive the amplified fist input signal from the first transistor, the second transistor configured to amplify the amplified first input signal and to output a first output signal; and
   a second amplifier comprising:
      a third transistor having a gate configured to receive a second input signal, the third transistor configured to amplify the second input signal and to output an amplified second input signal;
      a fourth transistor coupled to the third transistor, the fourth transistor having a gate configured to receive the amplified second input signal from the third transistor, the fourth transistor configured to amplify the amplified second input signal and to output a second output signal;
      a first current source coupled to the first transistor and configured to bias the first transistor in the saturation region of operation;
      a second current source coupled to the third transistor and configured to bias the third transistor in the saturation region of operation; and
      a load resistor network coupled between the first and second amplifiers and configured to set gain values for the first and second amplifiers, the load resistor network comprising:
         a first resistor coupled to the output of the first amplifier;
         a second resistor coupled to the output of the second amplifier;
         a third resistor coupled between the first and second resistors, the ratio of the first and third resistors setting the gain value of the first amplifier, and the ratio of the second and third resistors setting the gain value of the second amplifier;
         a fourth resistor coupled between the first and second resistors; and
         a switch coupled to the fourth resistor, the switch being programmed to add the resistance value of the fourth resistor to either the resistance value of the first or third resistor thereby providing different gain values for the first and second amplifiers.

* * * * *